(12) United States Patent
Choi

(10) Patent No.: US 8,441,178 B2
(45) Date of Patent: May 14, 2013

(54) DISPLAY SUBSTRATE, ORGANIC LIGHT EMITTING DIODE DISPLAY DEVICE, AND MANUFACTURING METHOD THEREOF

(75) Inventor: Hee Dong Choi, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 638 days.

(21) Appl. No.: 11/966,599

(22) Filed: Dec. 28, 2007

(65) Prior Publication Data

US 2008/0231168 A1    Sep. 25, 2008

(30) Foreign Application Priority Data

Mar. 22, 2007    (KR) .................. 10-2007-0028057

(51) Int. Cl.
*H01L 51/52*    (2006.01)

(52) U.S. Cl.
USPC .................. 313/500; 313/509; 313/512

(58) Field of Classification Search .......... 313/498–512; 315/169.1, 169.3; 428/690–691, 917; 438/26–29, 438/34, 82; 257/40, 72, 98–100, 642–643, 257/759; 427/66, 532–535, 539
See application file for complete search history.

(56) References Cited

U.S. PATENT DOCUMENTS

| | | | | |
|---|---|---|---|---|
| 7,034,453 B2 * | 4/2006 | Kai et al. | ....................... | 313/504 |
| 7,042,024 B2 * | 5/2006 | Yamazaki et al. | ............. | 257/103 |
| 7,701,541 B2 * | 4/2010 | Yamazaki et al. | ............. | 349/141 |
| 8,129,902 B2 * | 3/2012 | Kai et al. | ....................... | 313/509 |
| 2002/0117736 A1 * | 8/2002 | Yamazaki et al. | ............ | 257/627 |
| 2003/0006697 A1 * | 1/2003 | Weaver | ......................... | 313/503 |
| 2003/0129790 A1 | 7/2003 | Yamazaki et al. | | |
| 2005/0224820 A1 * | 10/2005 | Yamazaki et al. | .............. | 257/79 |
| 2005/0264183 A1 | 12/2005 | Seo et al. | | |
| 2006/0006540 A1 * | 1/2006 | Park et al. | ..................... | 257/758 |
| 2006/0243989 A1 * | 11/2006 | Yamazaki et al. | .............. | 257/79 |
| 2007/0222383 A1 * | 9/2007 | Matsuda | ....................... | 313/512 |

FOREIGN PATENT DOCUMENTS

| | | |
|---|---|---|
| CN | 1419297 A | 5/2003 |
| CN | 1703126 A | 11/2005 |
| JP | 08-315981 | 11/1996 |
| JP | 2000-021579 | 1/2000 |
| JP | 2008-130363 | 6/2008 |

OTHER PUBLICATIONS

Office Action issued in corresponding Japanese Patent Application No. 2007-336111; issued Apr. 9, 2010.
Office Action issued in corresponding Chinese Patent Application No. 2007103083557; issued Apr. 14, 2009.

* cited by examiner

*Primary Examiner* — Anh Mai
*Assistant Examiner* — Fatima Farokhrooz
(74) *Attorney, Agent, or Firm* — Brinks Hofer Gilson & Lione

(57) ABSTRACT

A display substrate, an organic light emitting diode display device having the same, and a manufacturing method thereof are disclosed. The display substrate includes a first pixel separating portion and a second pixel separating portion extending from the pixel separating portion and disposed around a pixel portion. Therefore, the number of processes for forming the organic light emitting diode display device can be reduced, and corrosion of a first electrode of the organic light emitting diode display device can be prevented.

6 Claims, 6 Drawing Sheets ated around the pixel portion disposed on the pixel separating region, and the second pixel separating portion extending from the first pixel separating portion and being disposed on the upper surface of the insulating pattern that corresponds to a periphery of the pixel portion.

In another embodiment, a method for manufacturing a display substrate includes: providing a substrate defining a pixel portion including a light generation region for generating light, and a pixel separating region disposed around the light generation region; forming a thin film transistor in the light generation region; forming an insulating pattern covering the thin film transistor and exposing a portion of the thin film transistor on the substrate; and forming a pixel separating pattern including a first pixel separating portion and a second pixel separating portion, the first pixel separating portion being separated from an upper surface of the insulating pattern and disposed on the pixel separating region, and the second pixel separating portion extending from the first pixel separating portion and being disposed on the upper surface of the insulating pattern that corresponds to a periphery of the pixel portion.

In another embodiment, an organic light emitting diode display device includes: a pixel portion on a substrate, the pixel portion including a light generation region for generating light, and a pixel separating region around the light generation region; a thin film transistor in the light generation region; an insulating pattern on the substrate, the insulating pattern covering the thin film transistor and exposing a portion of the thin film transistor; a pixel separating pattern including a first pixel separating portion and a second pixel separating portion, the first pixel separating portion being separated from an upper surface of the insulating pattern and disposed on the pixel separating region, and the second pixel separating portion extending from the first pixel separating portion and being disposed on the upper surface of the insulating pattern that corresponds to a periphery of the pixel portion; a first electrode electrically connected with the thin film transistor, the first electrode being disposed on the light generation region by the pixel separating pattern; an organic emission layer on the first electrode; and a second electrode on the organic emission layer.

In still further another embodiment, a method for manufacturing an organic light emitting diode display device includes: providing a substrate defining a pixel portion including a light generation region for generating light, and a pixel separating region disposed around the light generation region; forming a thin film transistor in the light generation region; forming an insulating pattern covering the thin film transistor and exposing a portion of the thin film transistor on the substrate; forming a pixel separating pattern including a first pixel separating portion and a second pixel separating portion on the insulating pattern, the first pixel separating portion being separated from an upper surface of the insulating pattern and disposed on the pixel separating region, and the second pixel separating portion extending from the first pixel separating portion and being disposed on the upper surface of the insulating pattern disposed around the pixel portion; forming a first electrode on the insulating pattern corresponding to the light generation region, the first electrode being naturally patterned by the pixel separating pattern

DISPLAY SUBSTRATE, ORGANIC LIGHT EMITTING DIODE DISPLAY DEVICE, AND MANUFACTURING METHOD THEREOF

CROSS-REFERENCE TO RELATED APPLICATIONS

The present application claims priority under 35 U.S.C. 119 and 35 U.S.C. 365 to Korean Patent Application No. 2007-028057, filed on Mar. 22, 2007, which is hereby incorporated by reference in its entirety.

BACKGROUND

The present disclosure relates to an organic light emitting diode (OLED) display device, and more particularly, to a top emission type OLED display device that that increases reliability.

An OLED display device is a self-luminous type display device, and thus does not require a backlight unit such as is required in a liquid crystal display (LCD) device. Also, an OLED display device can be manufactured in a lightweight slim profile and through a simple manufacturing process. Also, as an OLED display device only requires a low voltage driving, has high emission efficiency and a wide viewing angle. OLED devices are in the limelight as a next generation display device.

The OLED display device includes a thin film transistor (TFT) disposed on a substrate, an OLED device electrically connected to the TFT to emit light, and a sealing substrate for covering the OLED device.

OLED display devices can be categorized into a bottom emission type display devices and a top emission type display devices depending on a direction in which the light is emitted.

Since the top emission type display device emits light through a sealing substrate, it can have a large aperture ratio compared to a bottom emission type display device. Also, in a top emission type display device, an aperture ratio is not influenced by a driving device, so that a variety of driving devices can be designed.

However, in a top emission type display device, a patterned cathode electrode is formed for each pixel using a conductive material having a corrosion characteristic, and then an organic emission layer and an anode electrode are formed on the cathode electrode, so that the cathode electrode is easily corroded. Accordingly, the top emission type OLED display device has a limitation in that the reliability is reducing due to the corrosion of the cathode electrode.

SUMMARY

Embodiments provide a display substrate used for manufacturing an organic light emitting diode display device that can prevent reliability of the organic light emitting diode display device from reducing due to the corrosion of a cathode electrode.

Embodiments also provide a method for manufacturing a display substrate.

Embodiments also provide an organic light emitting diode display device including a display substrate.

Embodiments also provide a method for manufacturing an organic light emitting diode display device.

In one embodiment, a display substrate includes: a pixel portion on a substrate, the pixel portion including a light generation region for generating light, and a pixel separating region around the light generation region; a thin film transistor in the light generation region; an insulating pattern on the and formed; forming an organic emission layer on the first electrode; and forming a second electrode on the organic emission layer.

The details of one or more embodiments are set forth in the accompanying drawings and the description below. Other features will be apparent from the description and drawings, and from the claims.

DETAILED DESCRIPTION OF THE EMBODIMENTS

An organic light emitting diode display device will now be described in detail with reference to the accompanying drawings.

Figure 1A:
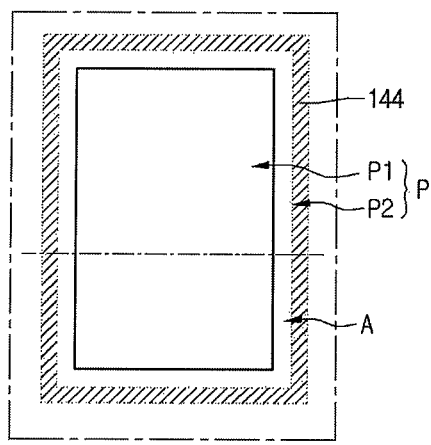
FIG. 1A is a plan view of a display substrate according to an embodiment.
Figure 1B:
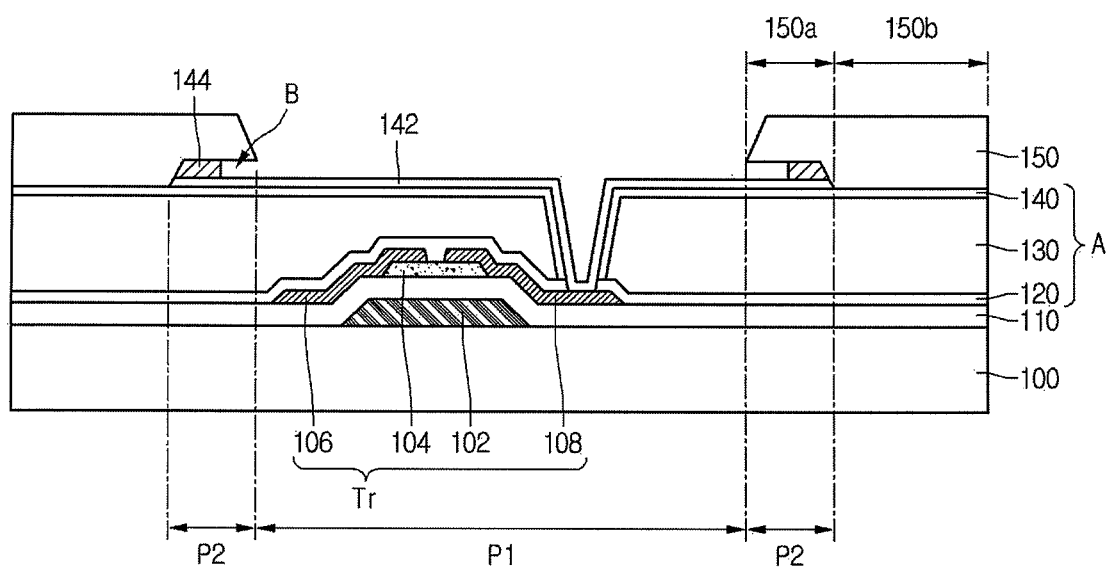
FIG. 1B is a cross-sectional view taken along a line I-I' of FIG. 1A.

FIGS. 1A and 1B are views explaining a display substrate according to an embodiment. Here, FIG. 1A is a plan view of a display substrate according to an embodiment, and FIG. 1B is a cross-sectional view taken along a line I-I' of FIG. 1A.

Referring to FIGS. 1A and 1B, a plurality of pixel portions P are disposed on a substrate 100 to display an image. Though not shown in the drawing, the pixel portion P can be defined by a gate line and a data line crossing each other on the substrate 100. At this point, a gate insulating layer 110 is interposed between the gate line and the data line, so that the gate line and the data line are insulated from each other.

Each pixel portion P includes a light generation region P1 and a pixel separating region P2 disposed along the periphery of the light generation region P1. The light generation region P1 is a region where light for displaying an image can be generated. Here, in the case where the display substrate is applied to an organic light emitting diode display device, an organic light emitting diode device (not shown) for generating light can be disposed in the light generation region P1. The pixel separating region P2 is a region designed for separating organic light emitting diode devices for each pixel portion P.

At least one thin film transistor (TFT) Tr is disposed in the light generation region P1. Here, the TFT Tr can be a driving TFT electrically connected with the organic light emitting diode device to be disposed in the light generation region P1 to drive the organic light emitting diode device.

The TFT Tr can include a gate electrode 102, a gate insulating layer 110 covering the gate electrode 102, a semiconductor pattern 104 disposed on a portion of the gate insulating layer 110 corresponding to the gate electrode 102, a source electrode 106 disposed on a portion of the semiconductor pattern 104, and a drain electrode 108 disposed on a portion of the semiconductor pattern 104 and separated from the source electrode 106. Here, the semiconductor pattern 104 can include an active layer formed of an amorphous silicon pattern, and an ohmic contact layer formed of amorphous silicon pattern doped with impurities. The ohmic contact layer is disposed between the semiconductor pattern 104 and the source electrode 106, and between the semiconductor pattern 104 and the drain electrode 108.

According to an embodiment, the shape of the TFT Tr is not limited to a bottom gate type TFT. For example, the TFT Tr can be a top gate type TFT.

An insulating pattern A covering the TFT Tr is disposed on the substrate 100. The insulating pattern A has a contact hole exposing a portion of the TFT Tr.

The insulating pattern A includes a passivation pattern 120 for covering the TFT Tr to protect the TFT Tr. Here, the passivation pattern 120 can be formed of an inorganic insulating material. For example, the passivation pattern 120 can be formed of a silicon oxide or a silicon nitride.

The insulating pattern A can further include a planar pattern 130 disposed on the passivation pattern 120. The planar pattern 130 prevents parasitic capacitance from being generated between the TFT Tr disposed under the passivation pattern 120, and a conductive pattern 142 or an organic light emitting diode device E which will be described later. Therefore, in the case where the display substrate is applied to a display device, the organic light emitting diode device E can be formed on the TFT Tr, so that the aperture ratio of the display device can be improved. The planar pattern 130 can be formed of an insulating material having small dielectric constant. Examples of a material that can be used for the planar pattern 130 include a BCB (benzo-cyclo-butene) resin and an acryl-based resin.

Also, the planar pattern 130 can have a planar upper surface. That is, the planar pattern 130 is disposed on the passivation pattern 120 to overcome a height difference formed on the passivation pattern 120 caused by the TFT and lines (e.g., a gate line and a data line). Accordingly, the conductive pattern or a first electrode which will be described later can be formed planar.

The insulating pattern A can further include a buffer pattern 140 disposed on the planar pattern 130. The buffer pattern 140 improves adhesive force between the planar pattern 130 and the conductive pattern 142. Also, in the case where the display substrate is applied to a display device, the buffer pattern 140 can prevent a harmful gas from the planar pattern 130 from deteriorating the organic light emitting diode device E. At this point, the buffer pattern 140 can be formed of an inorganic insulating material. For example, the buffer pattern 140 can be a silicon oxide pattern or a silicon nitride pattern.

Though the insulating pattern A has been described to include the passivation pattern 120, the planar pattern 130, and the buffer pattern 140 according to an embodiment, the insulating pattern A is not limited thereto. That is, the insulating pattern A can formed by stacking the passivation pattern 120 and the planar pattern 130. Also, the insulating pattern A can be formed by stacking the planar pattern 130 and the buffer pattern 140.

The conductive pattern 142 patterned for each pixel portion P is disposed on the insulating pattern A. That is, the conductive pattern 142 is disposed on the light generation region P1 and the pixel separating region P2. At this point, the conductive pattern 142 is electrically connected with the drain electrode 108 of the TFT Tr. The conductive pattern 142 prevents the drain electrode 108 exposed through a contact hole from being corroded by an outside environment. Also, though not shown, the conductive pattern 142 can be formed of the same material as that of a pad contact electrode covering a pad electrode (e.g., a gate pad electrode and a data pad electrode) providing an electrical signal to the TFT Tr. The conductive pattern 142 can be formed of a conductive material having stronger corrosion resistance than that of metal. For example, the conductive pattern 142 can be formed of indium-tin-oxide (ITO) or indium-zinc-oxide (IZO).

A pixel separating pattern 150 is disposed on the edge of the conductive pattern 142, and the insulating pattern A. In the case where the display substrate is applied to a display device, the pixel separating pattern 150 naturally patterns the first electrode of the organic light emitting diode device E for each pixel portion P.

The pixel separating pattern 150 includes a first pixel separating portion 150a disposed on a portion of the conductive pattern 142 corresponding to the pixel separating region P2, and a second pixel separating portion 150b disposed on the insulating pattern A. The upper surface of the conductive pattern 142 is separated from the lower surface of the first pixel separating portion 150a facing the upper surface of the conductive pattern 142. That is, the first pixel separating portion 150a has an undercut shape B in its lateral side contacting the conductive pattern 142. At this point, the lateral side of the undercut shape is disposed along the outer periphery of the light generation region P1. Though the first pixel separating portion 150a has been described to have the undercut shape in the drawing, the first pixel separating portion 150a is not limited thereto but can have a lateral side of an inverse taper shape. That is, the first pixel separating portion 150a can have a lateral side forming an acute angle with respect to the upper surface of the conductive pattern 142.

Also, the pixel separating pattern 150 can be formed of an inorganic insulating material. For example, the pixel separating pattern 150 can be formed of a silicon nitride or a silicon oxide.

A sacrificial pattern 144 can be further disposed inside the undercut shape B. That is, the sacrificial pattern 144 is interposed between the upper surface of the conductive pattern 142 and the lower surface of the first pixel separating portion 150a facing the upper surface of the conductive pattern 142. Here, the sacrificial pattern 144 forms the undercut shape B. The sacrificial pattern 144 can be formed of a material having higher etching selectivity than that of the conductive pattern 142. For example, the sacrificial pattern 144 can be formed of Mo.

Therefore, in the case where the display substrate is applied to a display device, particularly, to an organic light emitting diode display device according to an embodiment, a separate photolithography process for forming the first electrode using the pixel separating pattern does not need to be performed. Also, in a conventional method, the first electrode, the organic emission layer and the second electrode are formed inside each other vacuum chamber as the first electrode is formed using photolithography process. So, the first electrode easily is corroded as it is exposed to an outside in or after process for forming the first electrode. Meanwhile, since an organic emission layer and a second electrode are formed inside a vacuum chamber for forming the first electrode in the present invention, a time for which the first electrode is exposed to an outside can be reduced or removed, so that the first electrode is prevented from being corroded. Therefore, a display device of excellent reliability can be manufactured using the display substrate.

FIGS. 2A to 2G are cross-sectional views explaining a method for manufacturing a display substrate according to another embodiment. The manufacturing method according to the other embodiment can be used to manufacture the above-described display substrate according to that embodiment. Therefore, descriptions of the same parts are omitted. The same reference numerals are used for the same parts.

Figure 2A:
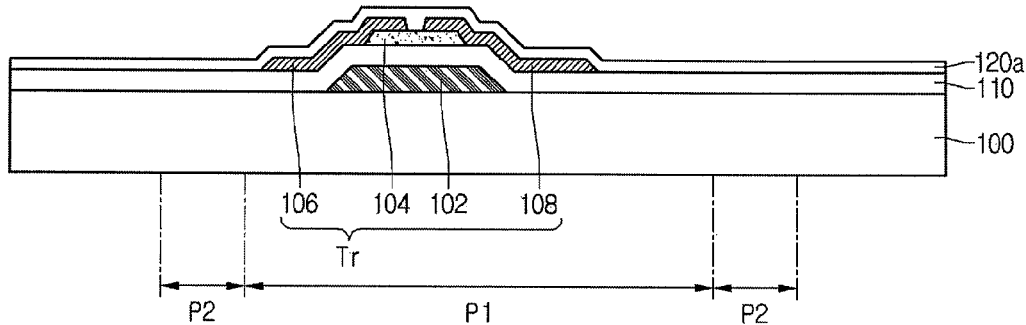
FIGS. 2A to 2G are cross-sectional views explaining a method for manufacturing a display substrate according to another embodiment.

Referring to FIG. 2A, a substrate 100 is provided to manufacture a display substrate. The substrate 100 defines a pixel portion P for displaying an image. Here, the pixel portion P is divided into a light generation region P1 where light for displaying an image is generated, and a pixel separating region P2 disposed along the periphery of the light generation region P1.

A TFT Tr is formed on a portion of the substrate 100 corresponding to the light generation region P1.

In detail, a gate electrode 102 is formed on the substrate 100 to form the TFT Tr. At this point, a gate line integrally formed with the gate electrode 102 is formed during a process for forming the gate electrode 102. A gate insulating layer 110 covering the gate electrode 102 is formed on the substrate 100. The gate insulating layer 110 can be formed of a silicon oxide or a silicon nitride. At this point, the gate insulating layer 110 can be formed using chemical vapor deposition (CVD). A semiconductor pattern 104 is formed on a portion of the gate insulating layer 110 corresponding to the gate electrode 102. The semiconductor pattern 104 can be formed by sequentially depositing amorphous silicon and amorphous silicon doped with impurities, and performing a patterning process thereon. After that, a source electrode 106 and a drain electrode 108 separated from each other are formed on the semiconductor pattern 104. Though not shown, a data line integrally formed with the source electrode 106 can be further formed during a process for forming the source electrode 106 and the drain electrode 108. At this point, the data line can be formed to cross the gate line. Here, a pixel portion P can be defined by the data line crossing the gate line. Accordingly, the TFT Tr can be formed on the substrate 100.

After that, a passivation layer 120a is formed on the substrate 100 covering the TFT Tr. The passivation layer 120a can be formed of an inorganic insulating material. For example, the passivation layer 120a can be formed of a silicon oxide or a silicon nitride. At this point, the passivation layer 120a can be formed using CVD.

Figure 2B:
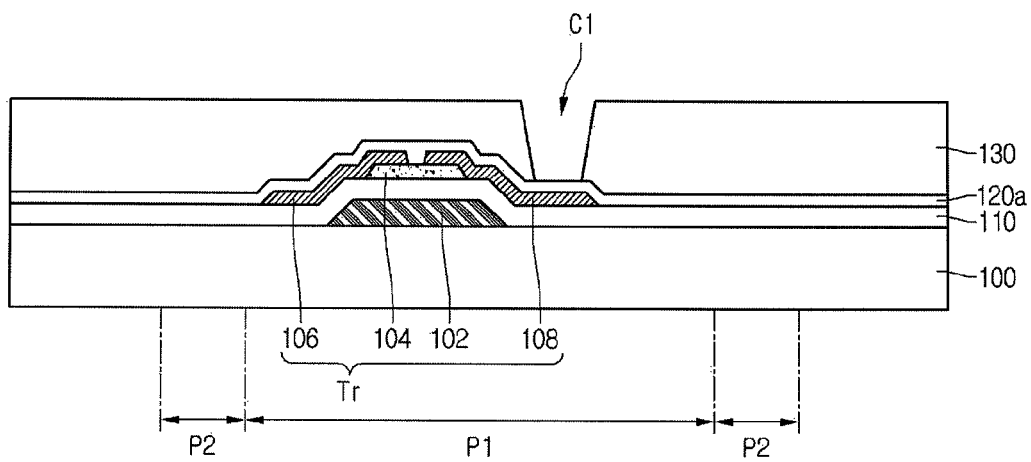

Referring to FIG. 2B, after the passivation layer 120a is formed, a planar pattern 130 including a first contact hole C1 exposing a portion of the passivation layer 120a corresponding to a portion of the TFT Tr is formed in the passivation layer 120a. A planar layer is formed on the passivation layer 120a to form the planar pattern 130. The planar layer can be formed of an insulating material having a small dielectric constant to prevent parasitic capacitance from being generated between the TFT and a conductive pattern 142 of FIG. 2G. At this point, examples of a method for forming the planar layer include spin coating, spray coating, dip coating, and inkjet printing. After that, a mask is aligned on the planar layer, and then light is illuminated from the mask onto the substrate 100. Subsequently, a developing process is performed on the substrate including an exposed planar layer to form the planar pattern 130.

Figure 2C:
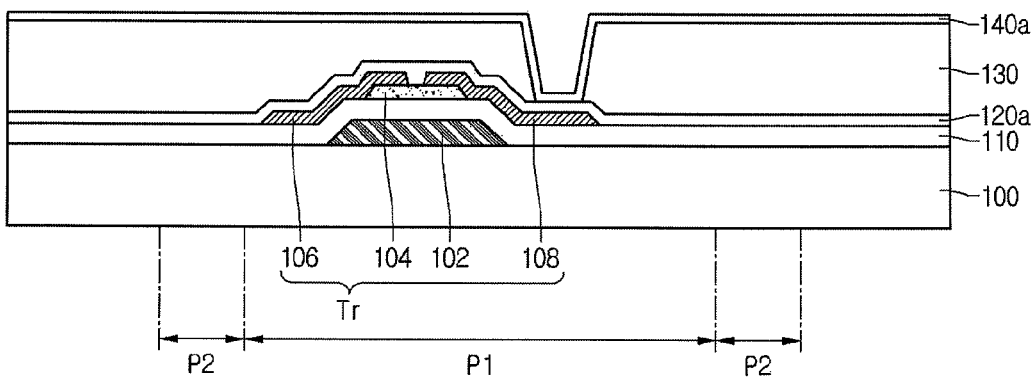

Referring to FIG. 2C, after the planar pattern 130 is formed, a buffer layer 140a is formed on the planar pattern 130. The buffer layer 140a can be formed of an inorganic insulating material. Examples of a material that can be used for the buffer layer 140a include a silicon nitride and a silicon oxide. At this point, the buffer layer 140a can be formed using CVD.

Figure 2D:
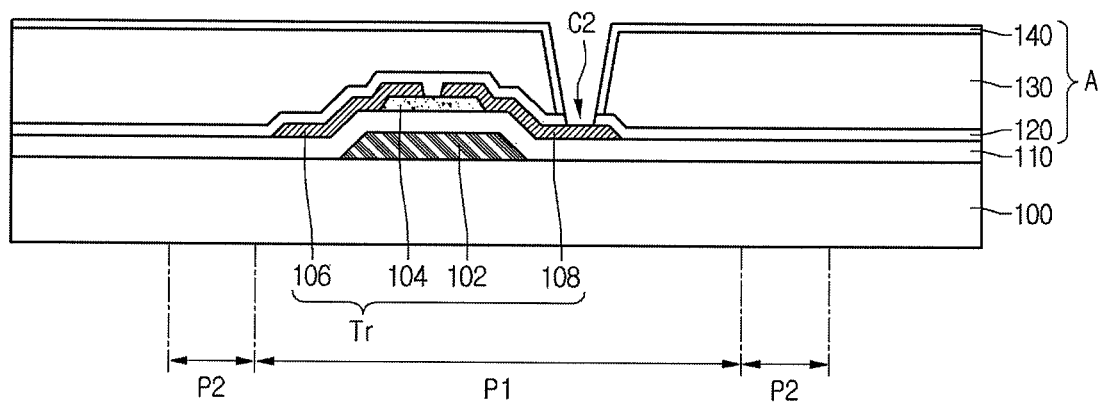

Referring to FIG. 2D, after the buffer layer 140a is formed, the buffer layer 140a and the passivation layer 120a are etched to form a buffer pattern 140 and a passivation pattern 120. At this point, the buffer pattern 140 and the passivation pattern 120 include a second contact hole C2 extending form the first contact hole C1 formed in the planar pattern 130. Therefore, an insulating pattern A including the passivation pattern 120, the planar pattern 130, and the buffer pattern 140 can be formed on the substrate 100. At this point, the insulating pattern A includes contacts holes, i.e., the first and second contact holes C1 and C2 exposing a portion of the TFT Tr, i.e., a portion of the drain electrode 108.

Figure 2E:
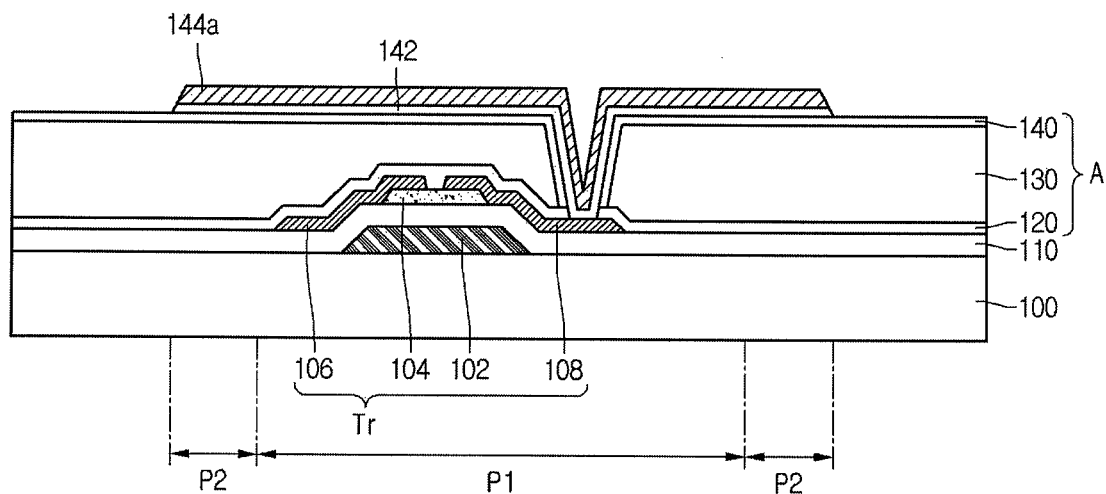

Referring to FIG. 2E, after the insulating pattern A is formed, a conductive pattern 142 and a preliminary sacrificial pattern 144a are formed on the insulating pattern A.

In detail, a conductive layer and a sacrificial layer are sequentially formed on the insulating pattern A to form the conductive pattern 142 and the preliminary sacrificial pattern 144a.

The conductive layer can be formed of a conductive material having at least higher corrosion resistance than that of metal. For example, the conductive layer can be formed of ITO or IZO. At this point, the conductive layer can be formed using vacuum deposition. For example, the conductive layer can be formed using sputtering of the vacuum deposition.

The sacrificial layer is formed on the conductive layer. The sacrificial layer can be formed of a material having higher etching selectivity than that of the conductive layer. For example, the sacrificial layer can be formed of Mo.

A photoresist pattern is formed on a portion of the sacrificial layer corresponding to the pixel portion P. After that, the conductive layer and the sacrificial layer are etched using the photoresist pattern as an etch mask to form the conductive pattern 142 and the preliminary sacrificial pattern 144a. Subsequently, the photoresist pattern is removed from the preliminary sacrificial pattern 144a. Therefore, the conductive pattern 142 and the preliminary sacrificial pattern 144a patterned for each pixel portion P can be formed on the insulating pattern A.

Figure 2F:
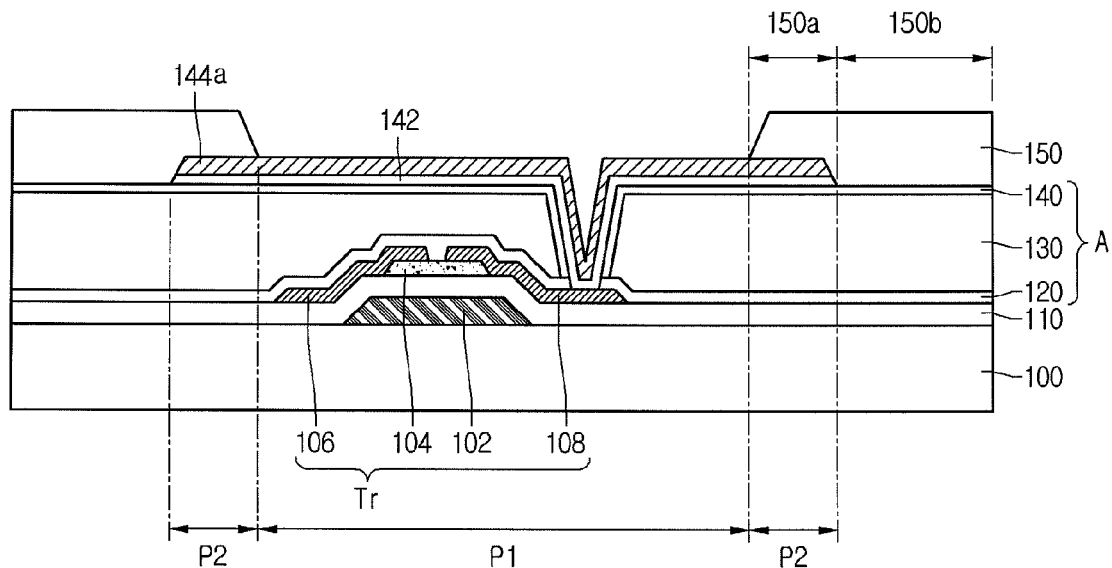

Referring to FIG. 2F, after the preliminary sacrificial pattern 144a is formed, a pixel separating pattern 150 is formed on the insulating pattern A including the preliminary sacrificial pattern 144a The pixel separating pattern 150 is disposed on the upper surface of the pixel separating region P2 and the periphery of the pixel separating region P2. Also, the pixel separating pattern 150 has an opening that is exposing a light generation region P1. The light generation region P1 is a region for substantially displaying an image.

In detail, first of all an inorganic layer is formed on the insulating pattern A to form the pixel separating pattern 150. After that, a photoresist pattern is formed on the inorganic layer, and then the inorganic layer is etched using the photoresist pattern as an etch mask to form the pixel separating pattern 150. Here, the inorganic layer can be formed of a silicon nitride or a silicon oxide.

Figure 2G:
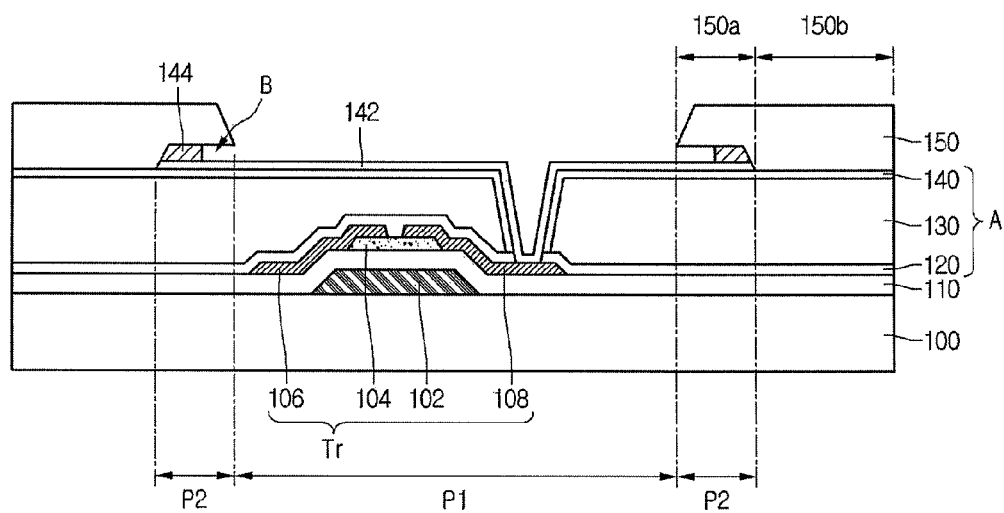

Referring to FIG. 2G, the preliminary sacrificial pattern 144a is wet-etched using the pixel separating pattern as an etch mask. At this point, the preliminary sacrificial pattern 144a is overly etched in comparison with the pixel separating region P2. Therefore, a first pixel separating portion having a lateral side of undercut shape B is formed in the pixel separating pattern 150. That is, the pixel separating pattern 150 includes the first pixel separating portion 150a in the pixel separating region P2, and a second pixel separating portion 150b disposed around the pixel portion P. Here, as the first pixel separating portion 150a has an undercut shape B, the first electrode can be naturally patterned for each pixel region by the first pixel separating portion 150 in the case a conductive material is deposited on a substrate including first pixel separating portion 150 to form the first electrode patterned for each pixel. Also, since the conductive pattern 142 is formed of a conductive material having corrosion resistance, corrosion of the TFT due to an outside environment can be prevented, so that the display substrate including the TFT can be easily stored.

Figure 3:
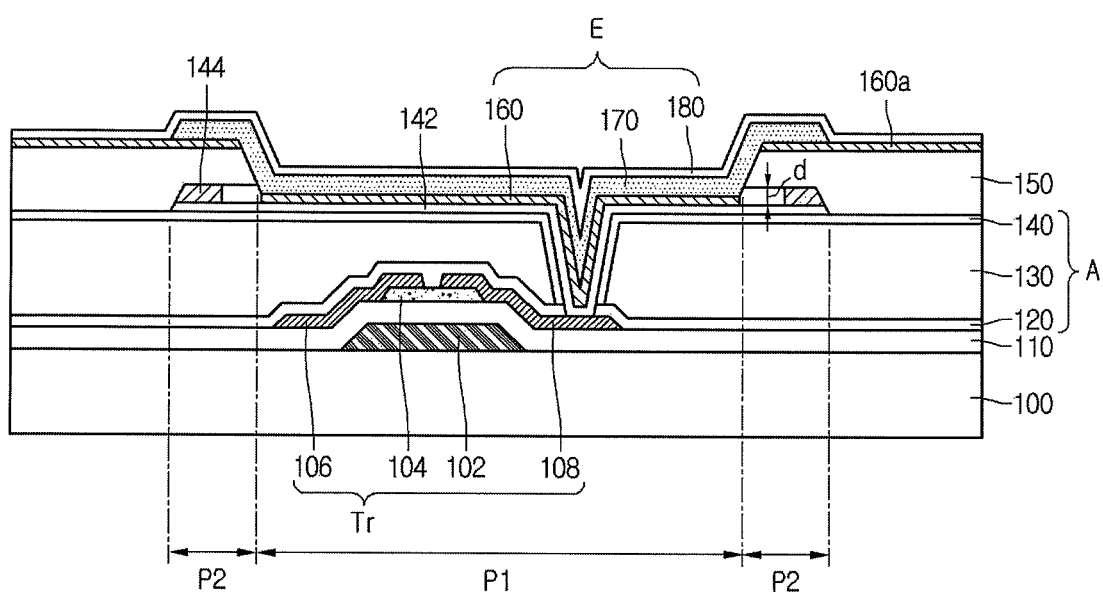
FIG. 3 is a cross-sectional view of an organic light emitting diode display device according to still another embodiment.

FIG. 3 is a cross-sectional view of an organic light emitting diode display device according to still another embodiment. Here, the still another embodiment relates to an organic light emitting diode display device manufacturing by using the display substrate according to the above-described previous embodiment. Therefore, descriptions of the same parts as those of the previous embodiment are omitted. The same reference numerals are used for the same parts.

Referring to FIG. 3, a substrate 100 defines a plurality of pixel portions P to display an image. Here, the pixel region P includes a light generation region P1 where light for displaying the image is generated, and a pixel separating region P2 for substantially defining the pixel portion P along the periphery of the light generation region P1.

A TFT Tr is disposed in the pixel portion P, that is, the light generation region P1. An insulating pattern A covering the TFT Tr is disposed on the substrate 100. The insulating pattern A includes a contact hole exposing a portion of the TFT Tr, that is, a portion of a drain electrode 108.

The conductive pattern 142 is disposed on a portion of the insulating pattern A corresponding to the pixel portion P. At this point, the conductive pattern 142 is electrically connected to the TFT Tr through the contact hole. Also, the conductive pattern 142 is formed of a conductive material having stronger corrosion resistance than that of a first electrode 160. Here, a sacrificial pattern 144 can be further disposed on a portion of the conductive pattern 142 corresponding to the pixel separating region P2. At this point, the sacrificial pattern 144 is used to form an undercut shape in a pixel separating pattern 150.

The insulating pattern A includes a passivation pattern 120 covering the TFT Tr, a planar pattern 130 disposed on the passivation pattern 120, and a buffer pattern 140 disposed on the planar pattern 130. Though the insulating pattern A has been described to include the passivation pattern 120, the planar pattern 130, and the buffer pattern 140, the insulating pattern A is not limited thereto. That is, the insulating pattern A can be formed by stacking the passivation pattern 120 and the planar pattern 130. Also, the insulating pattern A can be formed by stacking the planar pattern 130 and the buffer pattern 140.

The pixel separating pattern 150 exposing the light generation region P1 is disposed on the insulating pattern A. Here, a portion of the pixel separating pattern 150 is disposed on a portion of a conductive pattern 112 corresponding to the pixel separating region P2. Therefore, the pixel separating pattern 150 includes a first pixel separating portion 150a disposed on a portion of the conductive pattern 142 corresponding to the pixel separating region P2, and a second pixel separating portion 150b extending from the first pixel separating portion 150a and disposed around the pixel portion P.

The upper surface of the conductive pattern 142 is separated from the lower surface of the first pixel separating portion 150a facing the upper surface of the conductive pattern 142. For example, the lateral side of the first pixel separating portion 150a contacting the conductive pattern 142 has an undercut shape. Here, the height d of the undercut has a thickness greater than that of the first electrode 160. At this point, a difference between the height d and the thickness of the first electrode 160 can be in the range of 100-1,500 Å. Here, in the case where the difference between the height d and the thickness of the first electrode 160 is less than 100 Å, the first electrode 160 is not naturally patterned. Meanwhile, in the case where the difference between the height d and the thickness of the first electrode 160 exceeds 1,500 Å, a second electrode 180 to be formed on the first electrode 160 may be short-circuited.

The first electrode 160 is disposed on a portion of the conductive pattern 142 corresponding to the light generation region P1. Accordingly, the first electrode 160 is electrically connected with the TFT Tr through the conductive pattern 142. The first electrode 160 is separated for each pixel portion P, that is, the light generation region P2 by the pixel separating pattern 150. That is, the first electrode 160 is disposed on the pixel portion P. The first electrode 160 can be a conductive pattern reflecting light. For example, the first electrode 160 can be formed of Al or AlNd. A residual layer 160a of the first electrode 160 can be disposed on the second pixel separating portion 150b of the pixel separating pattern 150.

An organic emission layer 170 for generating light is disposed on the first electrode 160. In the organic emission layer 170, first charges provided from the first electrode 160 recombine with second charges provided from the second electrode 180 to generate light. The second electrode 180 is disposed on the organic emission layer 170. The second electrode 180 is used as a common electrode on all pixel regions P. At this point, the second electrode 180 can be formed of a transparent conductive material that can transmit light. For example, the second electrode 180 can be formed of ITO or IZO.

Therefore, light generated by the organic emission layer 170 passes through the second electrode 180 to provide an image.

In an organic light emitting diode display device according to an embodiment, a first electrode, an organic emission layer, and a second electrode can be formed inside a vacuum chamber by a pixel separating pattern, so that corrosion of the first electrode due to an outside environment can be prevented.

Figure 4A:
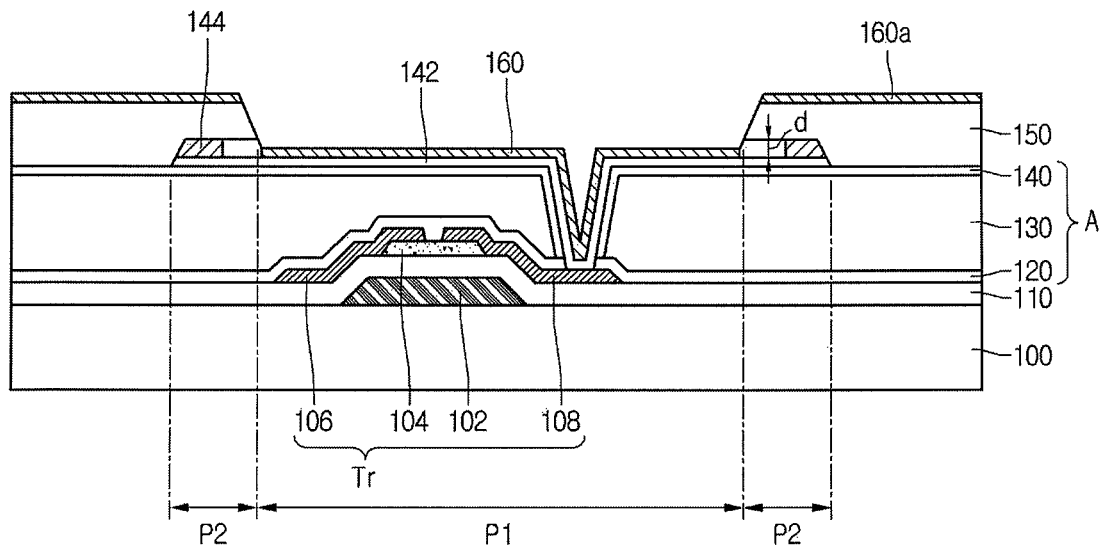
FIGS. 4A and 4B are cross-sectional views explaining a method for manufacturing a display substrate according to further another embodiment.
Figure 4B:
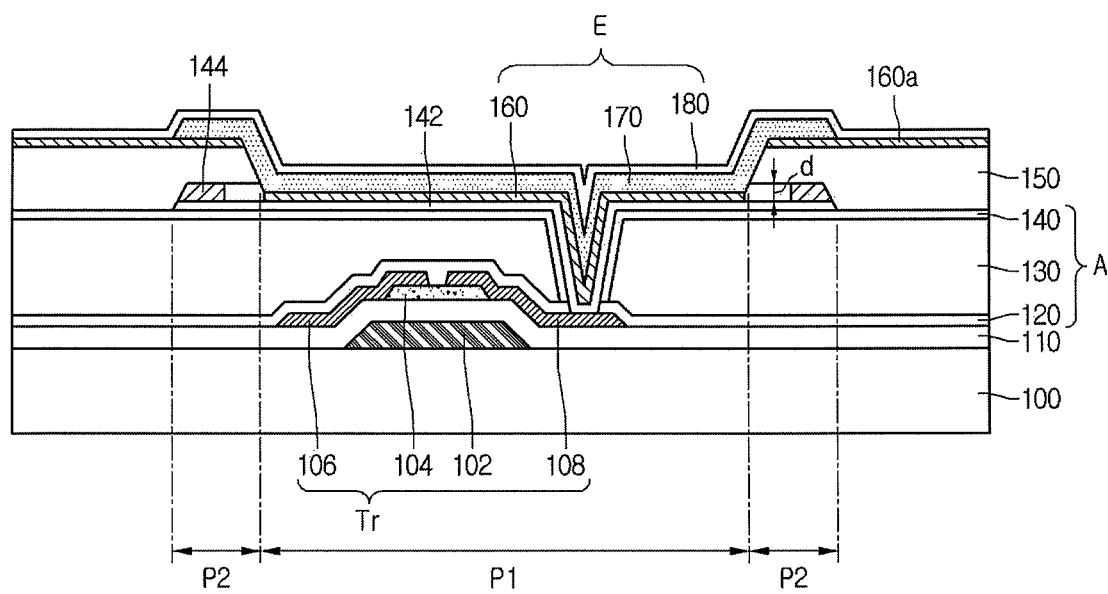

FIGS. 4A and 4B are cross-sectional views explaining a method for manufacturing an organic light emitting diode display device according to further another embodiment. The method according to the further another embodiment manufactures an organic light emitting diode display device using the display substrate manufactured according to the above-described previous embodiment. Therefore, descriptions for the same parts are omitted. The same reference numerals are used for the same parts.

Referring to FIG. 4A, a substrate 100 including a pixel separating pattern 150 is provided. Here, the substrate 100 defines a plurality of pixel portions P to display an image. Each pixel region P includes a light generation region P1 where light is generated, and a pixel separating region P2 disposed around the light generation region P1.

A TFT Tr, an insulating pattern A covering the TFT Tr, and a conductive pattern 142 electrically connected to the TFT Tr and having an area corresponding to the pixel portion P are disposed between the pixel separating pattern 150 and the substrate 100.

The pixel separating pattern 150 includes a first pixel separating portion 150a disposed on a portion of the conductive pattern 142 corresponding to the pixel separating region P2, and a second pixel separating portion 150b extending from the first pixel separating portion 150a and disposed on the insulating pattern A. At this point, the lateral side of the first pixel separating portion 150a has an undercut shape. Here, the height of the undercut shape is greater than the thickness of a first electrode to form the first electrode using a natural patterning process.

Metal is deposited on the substrate 100 including the pixel separating pattern 150. At this point, the first electrode 160 disposed on the light generation region P1, and a residual layer 160a disposed on the pixel separating region P2 and the second pixel separating portion 150b are formed. The first electrode 160 and the residual layer 160a are naturally separated for each pixel at the boundary of the pixel separating region P2 by the first pixel separating portion 150a.

Therefore, the first electrode patterned for each pixel portion P, that is, each light generation region P2 can be formed without a separate patterning process.

Referring to FIG. 4B, after the first electrode 160 is formed, an organic emission layer 170 is formed on the first electrode 160. After that, a second electrode 180 is formed on the organic emission layer 170. Here, the first electrode 160, the organic emission layer 170, and the second electrode 180 can be formed inside a vacuum chamber. Therefore, the first electrode is not exposed to an outside environment, or a time for which the first electrode is exposed to an outside environment can be reduced, so that corrosion of the first electrode 160 can be prevented. Therefore, an organic light emitting diode display device having high reliability can be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display device comprising:
    a pixel portion on a substrate, the pixel portion comprising a light generation region that generates light, and a pixel separating region around the light generation region;
    a thin film transistor in the light generation region;
    an insulating pattern on the substrate, the insulating pattern covering the thin film transistor and exposing a portion of the thin film transistor, wherein the insulating pattern has a via hole corresponding with the exposed portion of the thin film transistor and the via hole is removed of the insulating pattern;
    a conductive pattern being electrically connected to the thin film transistor through by the exposing and being on the pixel portion and being formed on a whole area of the light generation region;
    a pixel separating pattern comprising a first pixel separating portion and a second pixel separating portion, the first pixel separating portion having a lateral side of a undercut shape and disposed on the pixel separating region, and the second pixel separating portion extending from the first pixel separating portion and being disposed on the upper surface of the insulating pattern that corresponds to a periphery of the pixel portion;
    a first electrode electrically connected with the thin film transistor, the first electrode being disposed on the conductive pattern of the light generation region and naturally patterned for each pixel by the undercut of the pixel separating pattern;
    an organic emission layer on the first electrode; and
    a second electrode on the organic emission layer,
    wherein the pixel separating pattern has an opening that is exposing the light generation region,
    wherein the first pixel separating portion being separated from an upper surface of the conductive pattern and having a space between the first pixel separating portion and the upper surface and a sacrificial pattern is formed in the space of the first pixel separating portion to form the undercut of the pixel separating pattern, and wherein the conductive pattern is formed on the insulating pattern that includes a passivation pattern covering the thin film transistor, a planar pattern on the passivation pattern, and a buffer pattern on the planar pattern, wherein the buffer pattern is formed on an inner surface of the via hole and the conductive pattern is formed on the buffer pattern in the inner surface of the via hole, wherein the second electrode and the residual layer of the first electrode are formed on the pixel separating pattern and wherein the first electrode is formed on the conductive pattern such that the buffer pattern, the conductive pattern and the first electrode are stacked on the inner surface of the via hole.

2. The organic light emitting diode display device according to claim 1, wherein the undercut shape has a height greater than a thickness of the first electrode.

3. The organic light emitting diode display device according to claim 1, the conductive pattern is disposed between the insulating pattern and the first electrode.

4. The organic light emitting diode display device according to claim 1, wherein the conductive pattern is formed of a conductive material having corrosion resistance greater than that of the first electrode.

5. The organic light emitting diode display device according to claim 1, wherein the first electrode comprises a conductive pattern reflecting light.

6. The organic light emitting diode display device according to claim 2, wherein a difference between the height of the undercut and the thickness of the first electrode is in a range of 100-1,500 Å.

* * * * *